United States Patent

Nakajima et al.

[11] Patent Number: 5,808,314
[45] Date of Patent: Sep. 15, 1998

[54] SEMICONDUCTOR EMISSION DEVICE WITH FAST WAVELENGTH MODULATION

[75] Inventors: Hisao Nakajima, Bagneux; Josette Charil, Neudon; Serge Slempkes, Germain en Laye, all of France

[73] Assignee: France Telecom, Paris, France

[21] Appl. No.: 704,892

[22] Filed: Aug. 30, 1996

[30] Foreign Application Priority Data

Sep. 8, 1995 [FR] France .................................. 95 10545

[51] Int. Cl.⁶ ........................... H01L 27/15; H01L 31/12; H01L 31/153; H01L 33/00
[52] U.S. Cl. ................................ 257/17; 257/21; 257/22; 257/84; 257/85; 257/98; 257/184; 359/248; 372/48; 372/50
[58] Field of Search ................................... 257/21, 17, 22, 257/84, 85, 98, 184; 359/248; 372/48, 50

[56] References Cited

U.S. PATENT DOCUMENTS

| 4,725,870 | 2/1988 | Bean et al. | 257/21 |
| 5,088,097 | 2/1992 | Ono et al. | 372/20 |
| 5,243,608 | 9/1993 | Chawki et al. | 372/8 |
| 5,485,014 | 1/1996 | Jain et al. | 257/21 |
| 5,493,438 | 2/1996 | Gay et al. | 359/246 |
| 5,611,003 | 3/1997 | Lesterlin et al. | 385/3 |

FOREIGN PATENT DOCUMENTS

| 484228 | 5/1992 | European Pat. Off. . | |
| 39 28 836 A1 | 12/1990 | Germany . | |
| 3-203268 | 9/1991 | Japan | 257/184 |

OTHER PUBLICATIONS

No Author, "Optical Switch," *IBM Technical Disclosure Bulletin*, vol. 29, No. 6, Nov. 1986, pp. 2708–2709.
European Search Report dated Nov. 28, 1996 for Application EP 96 30 6426.

IEEE Photonics Technology Letters, vol. 5, No. 3, Mar. 1993, New York pp. 354–356, S. Kuwano et al., "100PS Frequency Switching Without Bit Loss for a 10Gb/s Ask Modulated Signal".

IEEE Journal of Selected Topics in Quantum Electronics, vol. 1, No.2, Jun 1995, New York, pp. 396–400, F. Delorme et al., "Subnanosecond Tunable Distributed Bragg Reflector Lasers with an Electrooptical Bragg Section".

IEEE Journal of Selected Topics in Quantum Electronics, vol. 1, No. 2, Jun. 1995, New York, pp. 516–522, Shim J—I, et al., "1.5–UM InGaAsP–InP Mutligain–Levered–M-QW–DFB–LD with High Efficiency and large–Bandwidth FM Response".

IEEE Photonics Technology Letters, vol. 7, No. 2, Feb. 1995, pp. 185–187, Allovon M. et al., "Monolithic Integration on INP of a Wannier Stark Modulator with a Strained MQW DFB 1.55–M. Laser".

*Primary Examiner*—William Mintel
*Attorney, Agent, or Firm*—Pearne, Gordon, McCoy & Granger LLP

[57] ABSTRACT

The present invention relates to a semiconductor emission device with fast wavelength modulation and constituted by three sections, namely two lateral sections, each having an active layer and a DFB network and which produce an optical gain, connected across a central electroabsorbant section, to which is applied a reverse voltage making it possible to quasi-instantaneously modify the absorption rate in said section.

9 Claims, 6 Drawing Sheets

SEMICONDUCTOR EMISSION DEVICE WITH FAST WAVELENGTH MODULATION

TECHNICAL FIELD

The present invention relates to a semiconductor emission device, e.g. a distributed feedback or DFB laser with fast wavelength modulation.

PRIOR ART

A fast modification of the emission wavelength can be brought about with a distributed Bragg reflector or DBR laser having an electrooptical DBR section (E-O) as described in F. Delorme, B. Rose, A. Ramdane, B. Pierre & H. Nakajima, "Ultra-Fast Electro-Optical Distributed Bragg Reflector Laser For Optical Switching", Int. Conf. Semiconductor Lasers, Maui (USA), Paper Th2.2, September 1994 or a three-electrode DFB laser as described in S. Kuwano, Y. Trade & N. Shibata, "100 ps Frequency Switching Without Bit Loss For A 10 Gb/s ASK Modulated Signal", IEEE Photon. Techno. Lett., 5, pages 354–356. For a DBR laser, a switching time of 600 ps is measured for three modes spaced by 0.35 nm. The switching time is limited by the stray capacitance of the DBR section. For a three-electrode DFB laser, the switching time is 100 ps and 400 ps respectively for a swing of 0.16 nm (20 GHz) and 0.64 nm (80 GHz). In this case, the switching time is determined by the effective carrier life, which is approximately inversely proportional to the photon density, and to the differential gain. For frequency modulation, a very wide pass band of 18 GHz is obtained with a multiple quantum well or MQW DBF laser having a single section 90 μm long and a MQW DFB laser having two sections. The frequency modulation or FM efficiency is respectively 0.9 GHz/mA as described in M. Blez, D. Mathoorasing, C. Kazmierski, A. Ougazzaden, Y. Sorel, I. F. de Faria, D. Robein, G. Lemestreallan & J. Landreau, "20 kHz-18 GHz FM Bandwidth Single-Section MQW VUG DFB Lasers With FM Efficiency Higher Than 0.9 GHz/ma", Int. Conf. Indium Phosphide and Related Materials, Paris (France), Paper WD5, April 1993 and 1.5 GHz/mA. M. Bleez, D. Mathoorasing, C. Kazmierski, E. Ravis, A. Ougazzaden, G. Lemestreallan & D. Rodein, "2 Sections MQW VUG DFB Lasers With 18 GHz Bandwidth And 1.5 GHz/mA FM Efficiency", Int. Conf. Indium Phosphine And Related Materials, Santa Barbara (USA), Paper WP20, March 1994.

An E-O DBR laser can be very fast and is suitable for carrying out a wave-length switching. At present, the switching time is limited by the stray capacitance of the DBR section. Although the tuning range of the DBR laser is wider than that of the DFB laser, the modification of the wavelength takes place discontinuously in jumps. This feature is both very interesting and very prejudicial, as a function of the desired applications, because it is not possible to have a very small wavelength spacing (<0.2 nm) due to the length limitation (≈2 mm). This characteristic is very prejudicial for applications using a quasi-continuous tuning range.

For a DFB laser with two or three electrodes, the switching time is limited by the effective carrier life. The switching time increases with the wavelength swing. It is necessary to add there a limitation due to the RC product of the modulated section. A combination of these elements limits the switching time to about 100 ps.

The invention relates to obtaining an emitter able to very rapidly switch its operating wavelengths (laser emission).

DESCRIPTION OF THE INVENTION

The present invention relates to a semiconductor emission device with fast wavelength modulation, characterized in that it is constituted by three sections, namely two lateral sections each having an active layer and a DFB network and which produce an optical gain and which are connected across a central, electroabsorbant section, to which is applied a reverse voltage permitting a quasi-instantaneous modification of the absorption rate in said section.

Advantageously, said semiconductor emission device is a DFB laser.

In the field of optical telecommunications, the present invention can be applied to:

a very fast (>10 Gb/s) wavelength or frequency modulated signal emitter, a very fast (<100 ps) wavelength switch, a very fast (>5 Gb/s) optical pulse emitter of the soliton type.

The first devices produced had a wavelength modulation emission at 10 Gb/s and a wavelength switching time below 100 ps for a 0.3 nm swing. This time is only very slightly dependent on the wavelength swing. With a pulse modulation of 5 to 10 Gb/s, generation took place of 40 ps optical pulses with a very small chirp (<0.03 nm).

DETAILED DESCRIPTION OF THE INVENTION

Figure 1:
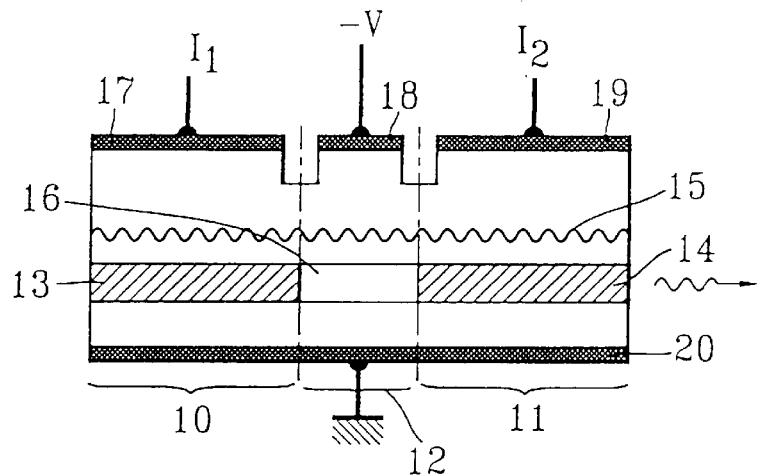
FIG. 1 illustrates the operating principle of the device according to the invention.

The invention relates to a DFB laser structure with three sections 10, 11 and 12. Each of two lateral sections 10 and 11 has an active layer 13, 14 and a DFB network 15, which produce an optical gain. They are connected across a central section 12 comprising an electroabsorbant layer 16. These three sections are provided on one face with a specific electrode respectively designated 17, 18, 19 and on their other face with a common electrode 20. The application of a reverse voltage −V to the central section permits a quasi-instantaneous modification of the absorption rate in said section, via the electroabsorbant effect, e.g. the Franz-Kaldysh effect described in L. V. Keldysh, O. V. Konstantinov & V. I. Perel, "Polarization Effects In the Interband Absorption of Light In Semiconductors Subjected To A Strong Electric Field", Sov. Phys. Semiconductors, 3, pages 876–884 (1970), the confined quantum start effect described described in D. A. B. Miller, D. S. Chemia, T. C. Damen, A. C. Gossard, W. Wiegmann, T. H. Wood & C. A. Burrus, "Band-Edge Electroabsorption In Quantum Well Structures: The Quantum-Confined Stark Effect", Phys. Rev. Lett., 53, pages 2173–2176 (1984) etc. In turn, this variation induces a variation of the carrier density at the threshold (which corresponds to the start of the laser effect) and modifies the refractive index of the active layers. This leads to a modification of the laser emission wavelength. The response time is dependent on the one hand on the time constant of the central section and on the other on the intrinsic resonant frequency fr of the active layers. The response time is determined by a convolution of these two factors. The time constant of the electroabsorbant section is determined by the stray capacitance, because the time constant of the electroabsorbant effect is zero. With a capacitance of 0.5 pF (for a 50 $\mu$m long section), which is an easily obtainable value with a semi-insulating structure, a RC product of 25 ps would be obtained corresponding to a speed or rate of 40 Gbit/s. However, the maximum speed is obtained taking account of the time constant associated with the resonant frequency ($\approx 0.5$/fr). This makes it possible to obtain a fast wavelength modulation laser, whose pass band is limited by the intrinsic resonant frequency.

Figure 2:
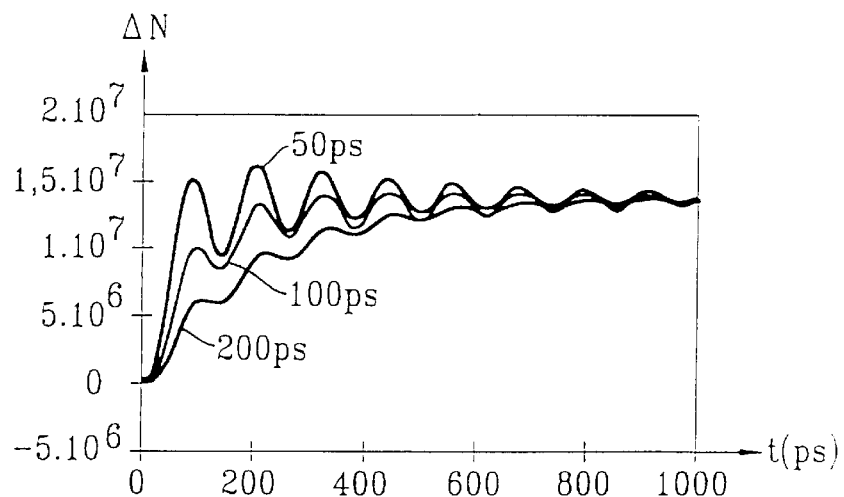
FIG. 2 illustrates the variation of the number of carriers as a function of time for a current of 100 mA and for different time constants.
Figure 3:
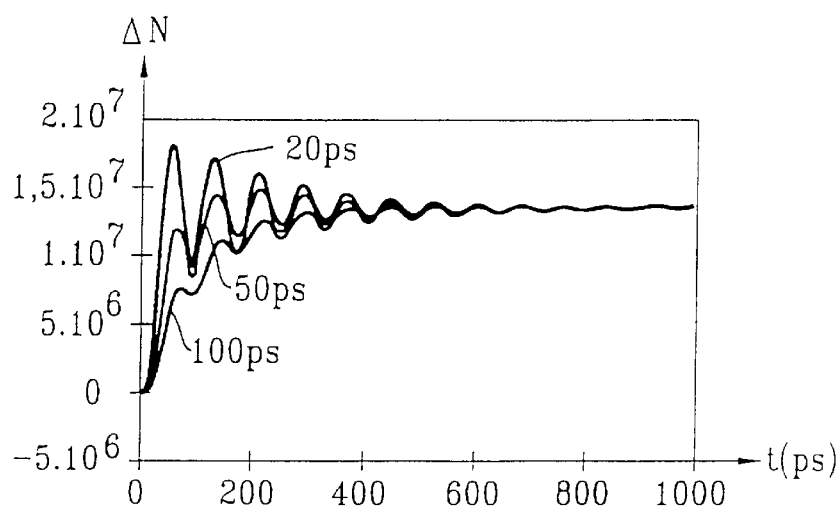
FIG. 3 illustrates the variation of the number of carriers as a function of time for a 200 mA current and for different time constants.

In order to demonstrate the validity of this approach, a modelling was carried out based on the "rates equations" described in G. P. Agrawal and N. K. Dutta, "Long-Wavelength Semiconductor Lasers", Van Nostrand Reinhold Company, New York, chapter 6, pages 220–227 . The equations were solved in the framework of a small signal approximation. The variation of the wavelength $\Delta\lambda$ can be calculated from the index variation dn=$\Gamma$ dn/dN* $\Delta$N, $\Gamma$ being the confinement factor, induced by a variation of the carrier density $\Delta$N by $\Delta\lambda$=2*pas*dn, "pas" being the spacing of the network or grid. It is assumed here that a reverse voltage is applied to the absorbant section inducing a linear absorption increase, which constitutes an approximation. Examination takes place of the effect of the time constant of this increase in the carrier density. For a laser operating current I=100 mA, the period of the relaxation oscillation is approximately 120 ps. When the time constant becomes lower than the oscillation half-period (60 ps), it is the relaxation oscillation which determines the response time. Thus, FIG. 2 illustrates the variation of the number of carriers $\Delta$N as a function of time t for I=100 mA for different time constants. This situation is similar for I=200 mA, where the half-period is 40 ps, as shown in FIG. 3. The minimum switching time is approximately 60 ps and 40 ps respectively for 100 and 200 mA.

Several specific embodiments will now be described.

DFB laser with a central, electroabsorbant section

Basic structure

Figure 4:
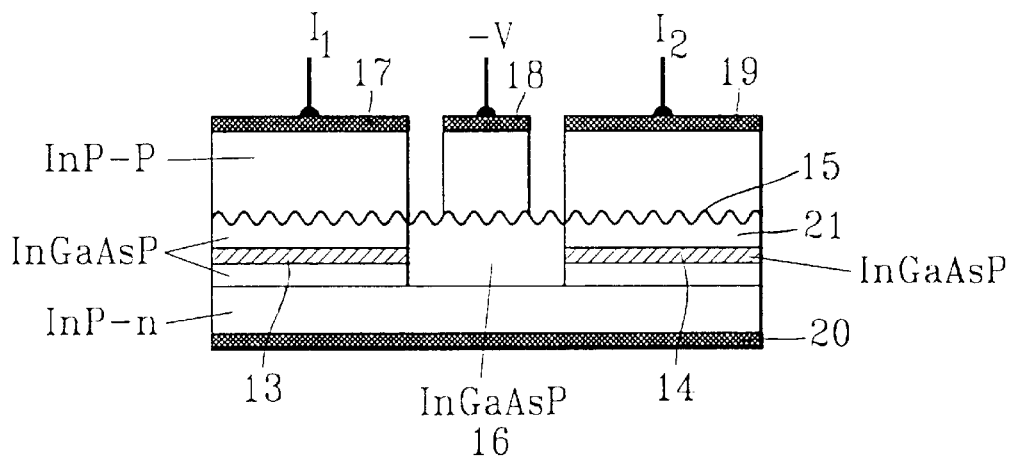
FIG. 4 illustrates the basic structure of a DFB laser according to the invention.

In order to prove the operating principle of the invention, a structure based on a buried ridge structure or BRS, described in J. Charil, S. Slempkes, D. Robein, C. Kazmierski & J. C. Bouley, "Extremely Low Threshold Operation of 1.5 $\mu$m GaInAsP/InP Buried Ridge Stripe Lasers", Electron. Lett., 25, pages 1477–1479 (1989), was produced, as shown in FIG. 4. This first structure has three sections, namely two lateral, amplifying sections for $\lambda$=1.55 $\mu$m, having an active layer ($\lambda_g$=1.55 $\mu$m) and a central, electroabsorbant section for $\lambda$=1.55 um ($\lambda_g$=1.47 $\mu$m). A grid of spacing 240 um, whose Bragg wavelength is 1.55 $\mu$m, etched in a confinement layer 21 (layer located on the active layers) backscatters the light at 1.55 $\mu$m. The respective length of the amplifying section, central section and amplifying section is typically 160, 60 and 160 $\mu$m. The light from the amplifying sections is coupled across the central section which is, without reverse bias, transparent at 1.55 $\mu$m. Therefore, the assembly functions as a DFB laser emitting at 1.55 $\mu$m when the lateral sections are forward biased. The application of a reverse voltage to the central section leads to an increase in the absorption due to the Franz-Keldysh effect. The electrical separation of the electrodes is brought about by a combination of reactive ion beam etching (RIBE) and chemical etching. A deep etching (down to the first quaternary layer) makes it possible to obtain a separation resistance of 2 K$\Omega$. An implantation of protons in the lateral regions of the stripe formed by the active layers 13, 14 and the electroabsorbant layer 16 makes it possible to reduce the leakage current and the stray capacitance. A capacitance of 4 pF/100 $\mu$m and a leakage current below 1 $\mu$A were obtained at −1 V.

Figure 5:
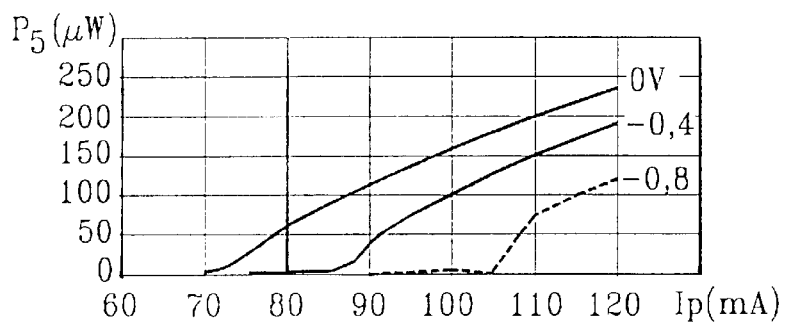
FIG. 5 illustrates the optical power as a function of the current for different reverse voltages for the laser illustrated in FIG. 4.

FIG. 5 shows the output power of the laser illustrated in FIG. 4 as a function of the bias current Ip (=$I_1$+$I_2$) for different reverse voltages applied to the electroabsorbant section. It reveals an increase in the threshold old current accompanied by a decrease in the optical power.

Figure 6A:
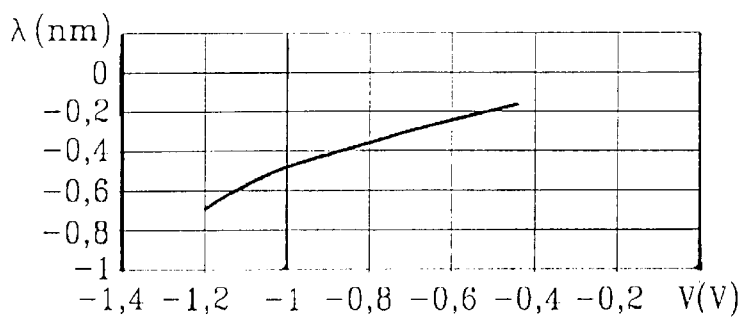
FIGS. 6A and 6B respectively show the wavelength and the relative power as a function of the reverse voltage for the laser illustrated in FIG. 4.
Figure 6B:
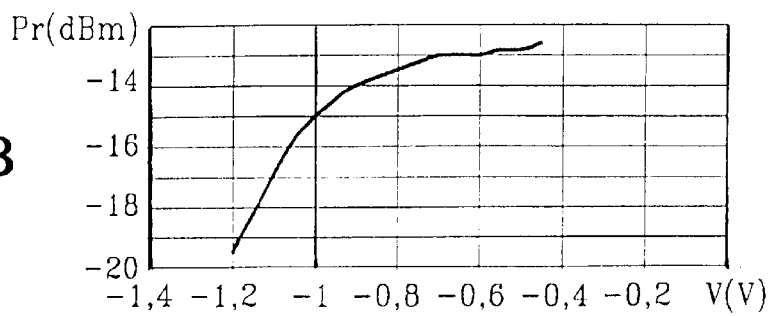
Figure 7:
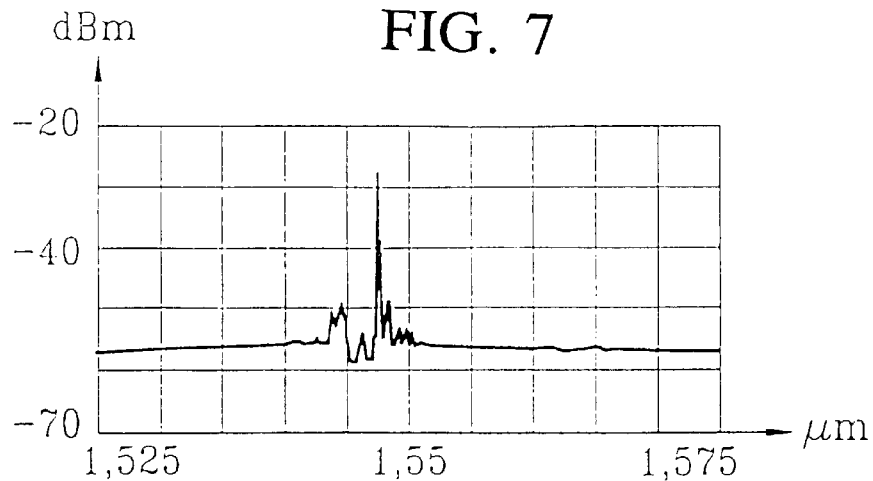
FIG. 7 illustrates the emission spectrum of said laser at I=71 mA.

FIGS. 6A and 6B show the effect of the reverse voltage respectively on the emission wavelength and the optical power. They respectively show the variation in the wavelength as a function of the reverse voltage V and the relative power Pr as a function of said voltage. Measurements were carried out by applying a pulse reverse voltage of 1 Gbit/s with a word length of 16 bits to a laser operating at I=120 mA. Therefore a relative power of −12 dB corresponds to a zero difference. The application of a reverse voltage of −1 V makes it possible to obtain a decrease of the wavelength of 0.5 um, while maintaining a less than 3 dB a reduction in the optical power. An emission spectrum at 71 mA is shown in FIG. 7.

Figure 8:
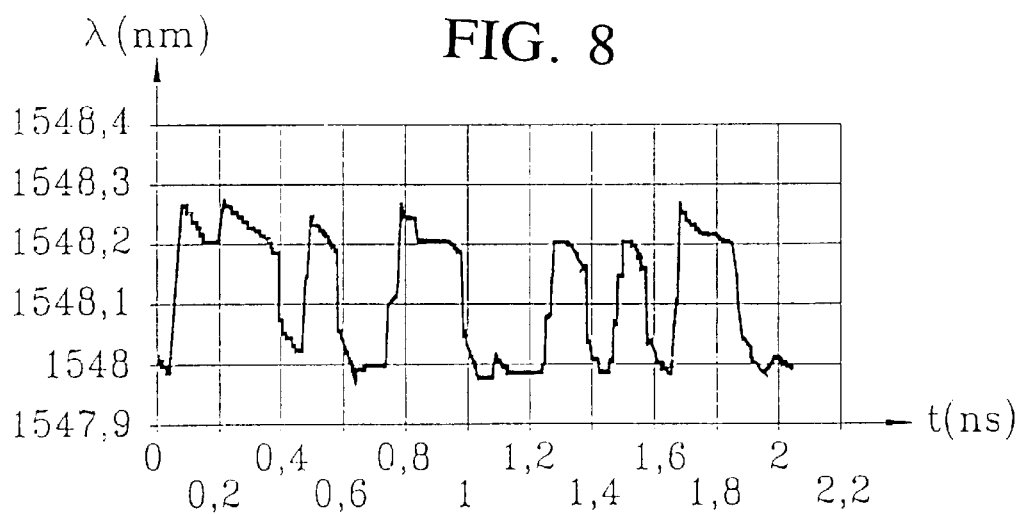
FIG. 8 illustrates the variation of the wavelength measured by applying a pseudo-random NRZ (non-return to zero) signal $2^7-1$ of 10 Gbit/s on the central section.

The switching time of the device was measured by applying a pseudo-random NRZ signal (word length $2^7$−1) of 10 Gbit/s. FIG. 8 reveals a variation in the wavelength $\lambda$ obtained with this signal. It is a wavelength modulation format. The departure and arrival wavelengths correspond respectively to the numerical wavelengths 0 and 1. As the amplitude of the signal is −0.7 V, there is a switching time below 100 ps, both for the rising and falling fronts. The filtering of one of the wavelengths makes it possible to detect the signal generated in wavelength modulation.

Figure 9:
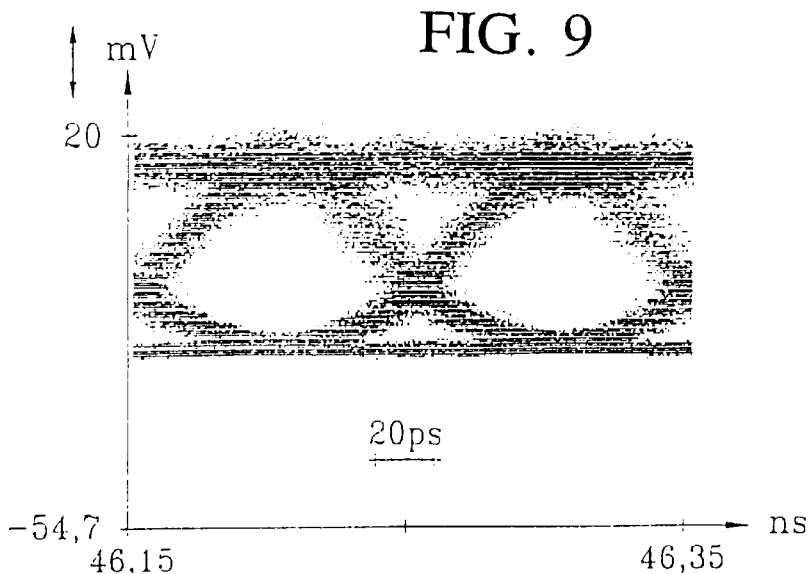
FIG. 9 illustrates the NRZ eye diagram at 10 Gbit/s.

FIG. 9 shows an eye diagram obtained by detecting 0. A NRZ voltage ($2^{31}$−1) of 10 Gbit/s of −0.4 V is applied. The modulation efficiency (nm/V) is approximately 0.4 nm/V for said laser and the best value is 0.9 nm/V (or 5.6 GHz/mA).

Optical pulses were generated by applying a periodic reverse voltage to the central section. The laser is biased so that there is a laser effect at the time when the voltage is zero. The bias current is optimized by observing the shape of the optical pulses. A word generator is used as the periodic voltage source. The time width of the pulses is measured for speeds of 5 to 10 Gbit/s, the minimum width being 40 ps.

Figure 10:
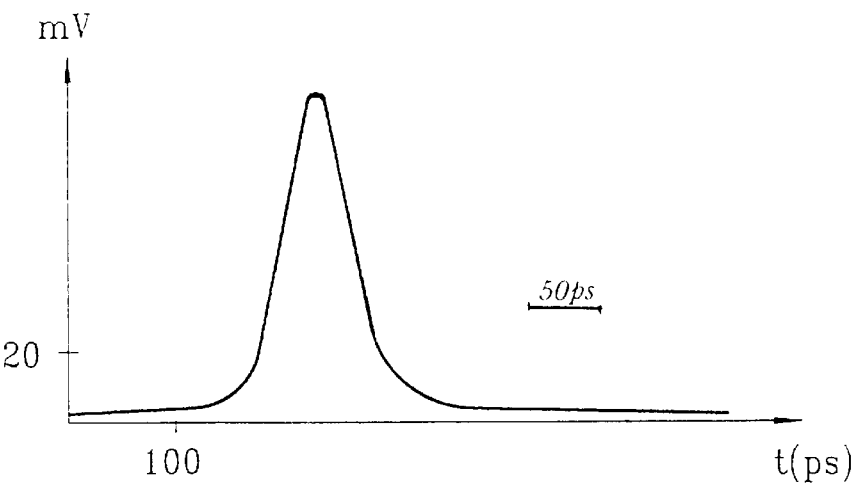
FIG. 10 illustrates the time form or shape of a generated pulse.

FIG. 10 shows the time shape of the optical pulses measured with a photodiode having a 32 GHz pass band and a 20 GHz oscilloscope, the width being 52 ps.

Figure 11:
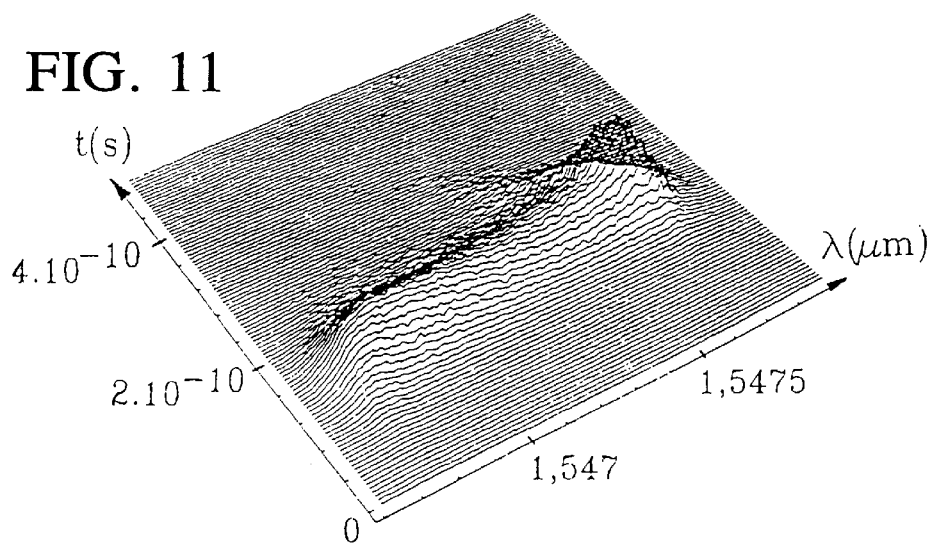
FIG. 11 illustrates the spectro-time division or distribution of the optical power of a pulse.

FIG. 11 shows the spectro-time division of the optical power of a pulse measured with the time resolved spectrum method.

Figure 12:
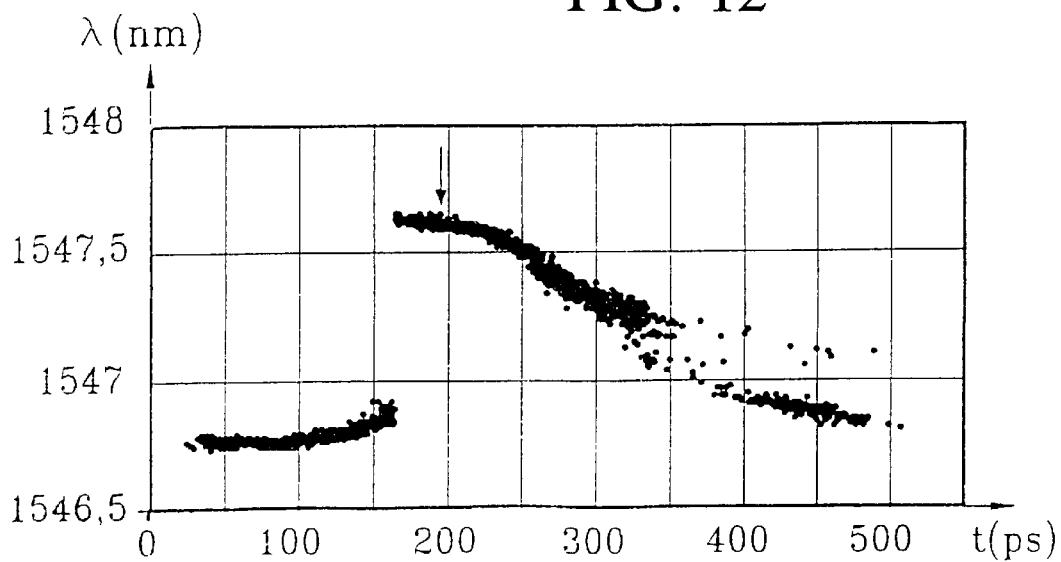
FIG. 12 illustrates the time evolution of the wavelength corresponding to the maximum power at a given instant.
Figure 13:
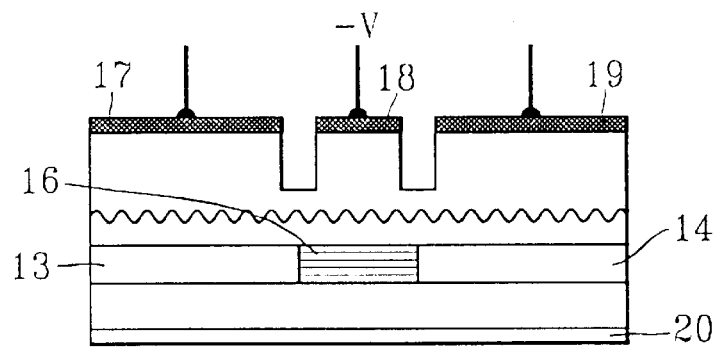
FIG. 13 illustrates a multiple quantum well absorbent section.

FIG. 12 shows a time evolution of the wavelength corresponding to the maximum power at a given instant. The arrow indicates the time position corresponding to the maximum power of a pulse. There is a very small chirp ($\approx 0.03$ nm) around the maximum power. A spectral limitation by a filter makes it possible to obtain pulses at the Fourier limit (i.e., a soliton, which is a solitary wave capable of traveling relatively large distances with little energy loss) Structure evolved Absorbant section 16 with multiple quantum wells (NQW) illustrated in FIG. 13, use being made of the Franz-Keldysh effect to implement the first devices with a central, electroabsorbant section. The use of effects associated with multiple quantum well structures such as the confined quantum Stark effect, Wannier-Stark effect P. Voisin, "Wannier-Stark Quantization And Its Application To Electro-Optical Modulation", Superlattices And Microstructures, 8, pages 323–327 (1990) or the BRAOWET effect (see J. E. Zucker, T. Y. Chang, M. Wegner, N. J. Sauer, K. L. Jones & D. S. Chemla, "Large Refractive Index Changes In Tunable-Electron-Density InGaAs/InAlAs Quantum Wells", IEEE Photon. Techn. Lett., 2, pages 29–31 (1990) makes it possible to improve the device, while retaining the same operating principle. Only the production processes differ.

Figure 14:
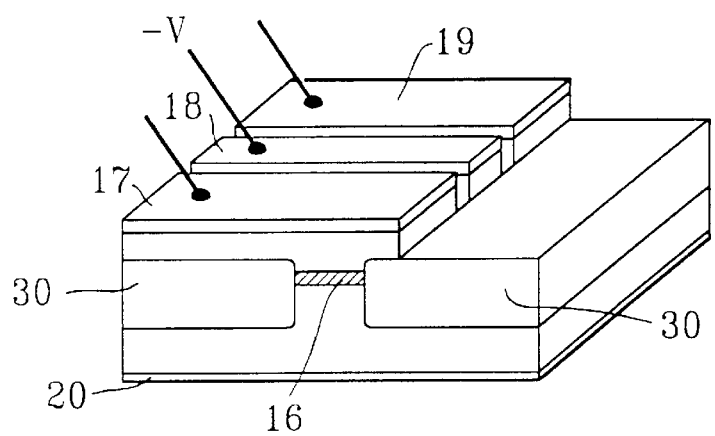
FIG. 14 illustrates a structure with a semi-insulant.

Structure with semi-insulant, the semi-insulating InP layers 30 being illustrated in FIG. 14. One of the most effective structures for obtaining a low stray capacitance is without doubt obtained by effectively using an InP semi-insulant. The use of the latter in place of InP-p, particularly in the lateral vicinity of the stripe, makes it possible to reduce both the stray capacitance and the leakage current (forward and reverse) as a result of an improved electrical insulation. Such a contribution is appreciable, particularly for obtaining fast devices.

Figure 15:
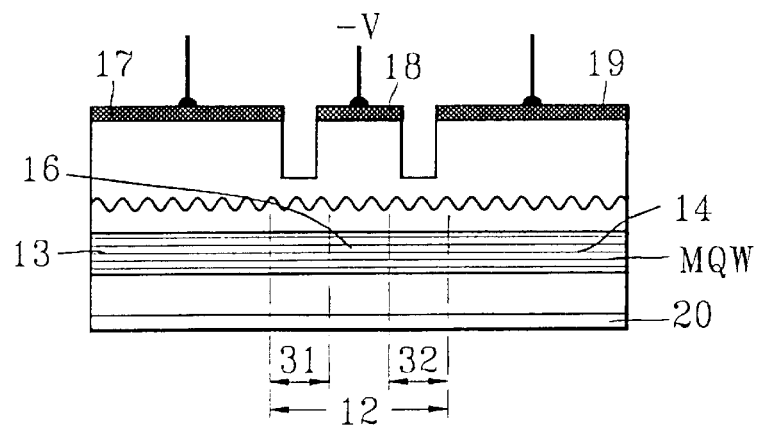
FIG. 15 illustrates a structure obtained by selective surface epitaxy.

Structure obtained by selective surface epitaxy as illustrated in FIG. 15. A structure based on end to end coupling requires a localized epitaxy for obtaining the electroabsorbant section 16. One of the possibilities for producing such a structure consists of using the selective surface epitaxy method. The use of the latter makes it possible to implement devices essentially corresponding to the diagram illustrated in FIG. 1. In this case, the coupling between the lateral sections 1.55 μm (10 and 11 in FIG. 1 and 13 and 14 in FIG. 15) and the electroabsorbant section takes place progressively in transition zones 31 and 32. The localized epitaxy consists of a localized growth of the materials, whereas selective surface epitaxy brings about a growth of materials, whose gap energy is dependent on the geometrical shape and the surface of the mask used. This makes it possible to obtain a horizontal structure formed from several gap materials differing in a single epitaxial stage. This method can make a determinative contribution to the implementation of the highest performance devices.

Figure 16:
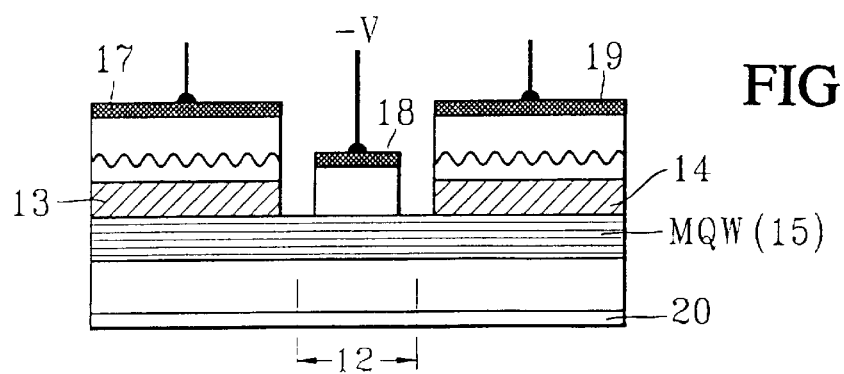
FIG. 16 illustrates a structure with evanescent coupling.

The evanescent coupling structure makes it possible to decrease the number of technological stages. The device also has three sections, the two amplifying sections and an electroabsorbant guide being stacked, as illustrated in FIG. 16. The light emanating from the amplifying sections 13 and 14 is coupled in evanescent manner to the electroabsorbant guide 15. The electroabsorbant effect is obtained by applying a reverse voltage to the central part of the guide 12. The guide can be made from solid materials or quantum wells.

Applications

Very fast (>10 Gb/s) frequency or wavelength modulated signal emitter

Figure 17:
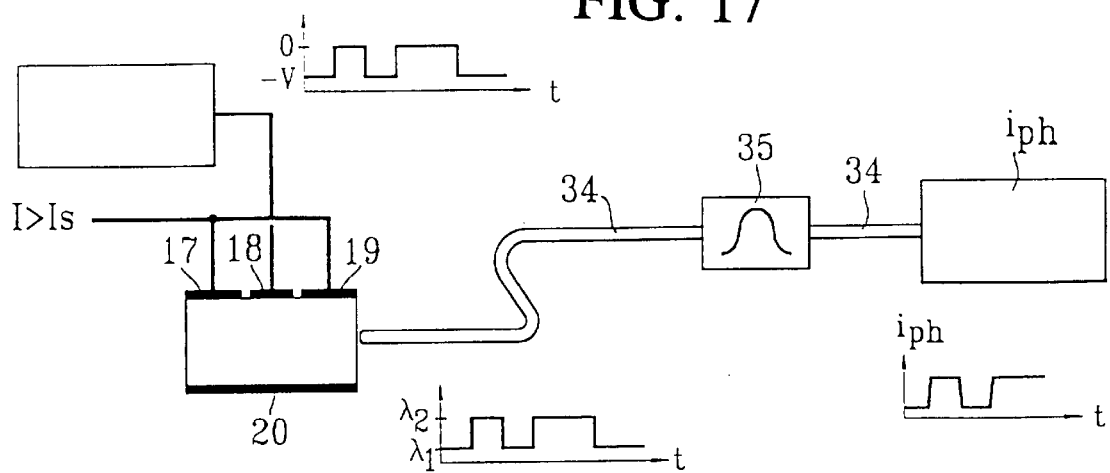
FIG. 17 illustrates a very fast (>10 Gbit/s) frequency or wavelength modulated signal emitter.

The use of the device according to the invention as an emitter, illustrated in FIG. 17, makes it possible to bring about a high speed link in wavelength shift keying (WSK) or frequency shift keying (FSK) for a low keying or modulation. For restoring the electric signal, the optical signal received, which is carried in an optical fibre 34, is filtered (35) at the basic wavelength length ($\lambda 1$) (or at the basic frequency) by an optical filter and is detected by a photodiode located at the filter output. The electric signal of the photodiode is proportional to the original signal.

Very fast wavelength switch (<100 ps)

Figure 18:
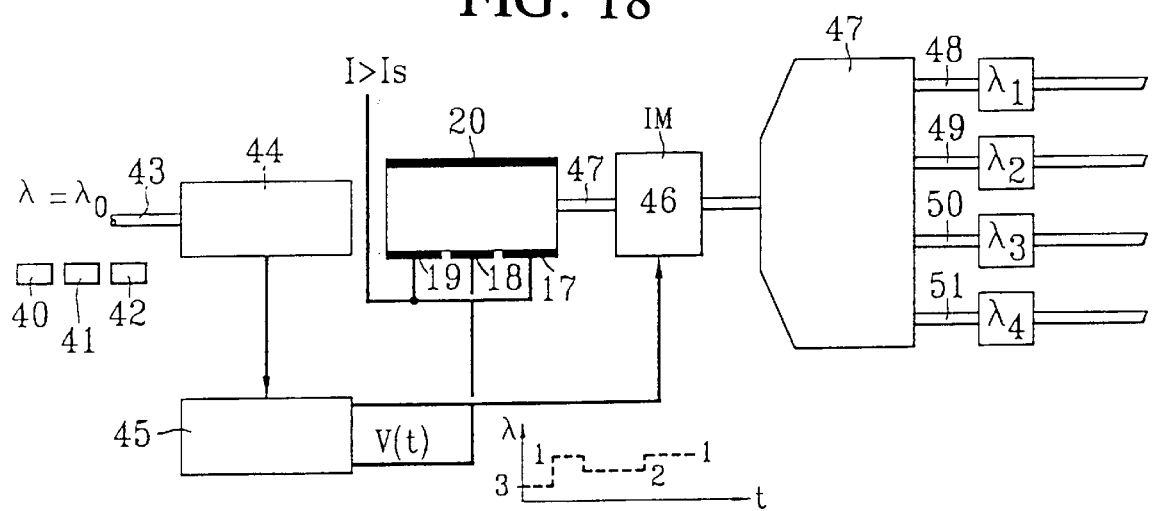
FIG. 18 illustrates a very fast wavelength switch (<100 ps).

A very good wavelength keying efficiency ($\approx 0$ 0.9 nm/V or 112 GHz/V) of the device according to the invention is utilized in distribution systems having several wavelengths (polychrome). An embodiment is a wavelength switch of ATM cells 40, 41, 42, illustrated in FIG. 18.

The signal carried by the fibre 43 is received by a receiver 44 connected to driver decoder 45, which on the one hand supplies a signal V(t) to the central electrode 18 of the device according to the invention and on the other a signal modulation to an IM modulator 46, which receives the signal from the device according to the invention via an optical fibre 47 and which supplies its output signal to an optical coupler 47, itself connected at the output to several optical fibres 48, 49, 50, 51, on which are located optical filters at wavelengths $\lambda 1$, $\lambda 2$, $\lambda 3$ and $\lambda 4$.

This device allocates a separate wavelength to each of the ATM cells. The wavelength change takes place between two successive cells (standby time). This change can be implemented in less than 100 ps, which is the bit time for a 10 Gb/s signal. After this change, the cells can be switched to different destinations. The number of wavelengths usable is determined by the tuning range divided by the channel spacing. With a voltage of −2 V, a range of 1.8 nm is obtained, which corresponds to 7 channels spaced by 0.3 nm.

High speed (>5 Gb/s) optical pulse emitter of the soliton type

Figure 19:
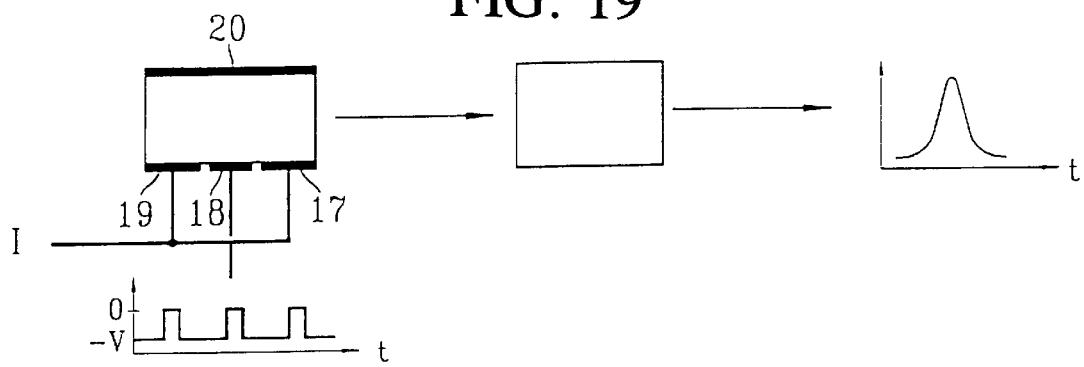
FIG. 19 illustrates a very fast (>5 Gbit/s) optical pulse emitter of the soliton type.

The device according to the invention, illustrated in FIG. 19, functions as an optical pulse emitter when its electroabsorbant section is modulated by a periodic reverse voltage. The filtering of the optical signal around the wavelength at which the optical power is at a maximum makes it possible to obtain solitons pulses at the Fourier limit.

We claim:

1. Semiconductor emission device with wavelength modulation, comprising two lateral sections, each lateral section having an active layer and a DFB network to produce an optical gain, and a central section joining the two lateral sections, the central section having an electroabsorbant layer, the electroabsorbant layer joining the active layers and quasi-instantaneously modifying the absorption rate in the central section when a reverse voltage is applied to the central section.

2. Device according to claim 1, wherein the lateral sections and the central section are provided with electrically separated electrodes, said electrical separation created by a combination of reactive ion beam etching and chemical etching.

3. Device according to claim 2, wherein the electrical separation has a resistance of 2KΩ.

4. Device according to claim 2, wherein the active layers are implanted with protons to reduce leakage current and stray capacitance.

5. Device according to claim 1, wherein the reverse voltage is periodic and optical pulses are generated by biasing the lateral sections with a bias current and adjusting the bias current so that a laser effect occurs at an instant when the periodic reverse voltage is zero.

6. Device according to claim 1, wherein the electroabsorbant layer is a multiple quantum well.

7. Device according to claim 1, further comprising a layer of InP semi-insulant material disposed adjacent the active layers and the electroabsorbant layer.

8. Device according to claim 1, wherein the active layers and the electroabsorbant layer are progressively coupled in transition zones, said transition zones grown by selective surface epitaxy.

9. Device according to claim 1, wherein the electroabsorbant layer extends into the lateral sections so that the active layers are stacked with the electroabsorbant layer and the optical gain is evanescently coupled with the electroabsorbant layer.

* * * * *

UNITED STATES PATENT AND TRADEMARK OFFICE
CERTIFICATE OF CORRECTION

PATENT NO. : 5,808,314
DATED : September 15, 1998
INVENTOR(S) : Nakajima et al.

It is certified that error appears in the above-identified patent and that said Letters Patent is hereby corrected as shown below:

Column 1, line 42-43, delete "Phosphine" and insert --Phosphide--.

Column 3, line 14, delete "Kaldysh" and insert --Keldysh--.

Column 4, line 37, delete "old".

Column 4, line 49, delete "um" and insert --nm--.

Column 5, line 22, delete "(NQW)" and insert --(MQW)--.

Column 5, line 30, delete "BRAOWET" and insert --BRAQWET--.

Column 6, line 52, delete "solitons" and insert --soliton--.

Signed and Sealed this

Twenty-third Day of March, 1999

Attest:

Attesting Officer

Q. TODD DICKINSON

Acting Commissioner of Patents and Trademarks